United States Patent
Kimmerle et al.

(10) Patent No.: US 8,316,688 B2
(45) Date of Patent: Nov. 27, 2012

(54) METHOD FOR CARRYING OUT A SELF-TEST FOR A MICROMECHANICAL SENSOR DEVICE, AND CORRESPONDING MICROMECHANICAL SENSOR DEVICE

(75) Inventors: Stefan Kimmerle, Neuffen (DE); Michael Baus, Bietigheim-Bissingen (DE)

(73) Assignee: Robert Bosch GmbH, Stuttgart (DE)

( * ) Notice: Subject to any disclaimer, the term of this patent is extended or adjusted under 35 U.S.C. 154(b) by 154 days.

(21) Appl. No.: 12/873,879

(22) Filed: Sep. 1, 2010

(65) Prior Publication Data

US 2011/0067506 A1     Mar. 24, 2011

(30) Foreign Application Priority Data

Sep. 1, 2009 (DE) .......................... 10 2009 029 073

(51) Int. Cl.
*G01P 21/00* (2006.01)
(52) U.S. Cl. ....................................... 73/1.38
(58) Field of Classification Search ........................ None
See application file for complete search history.

(56) References Cited

U.S. PATENT DOCUMENTS 6,564,637 B1 * 5/2003 Schalk et al. .............. 73/504.12
7,555,929 B2 * 7/2009 Emmerich et al. ............. 73/1.38
2008/0103705 A1 * 5/2008 Hammerschmidt ............ 702/57

FOREIGN PATENT DOCUMENTS

DE    10 2004 026 971    12/2005

* cited by examiner

*Primary Examiner* — Robert R Raevis
(74) *Attorney, Agent, or Firm* — Kenyon & Kenyon LLP

(57) ABSTRACT

A method for carrying out a self-test for a micromechanical sensor device, and a corresponding micromechanical sensor device. The method has the following steps: exciting the sensor device using a first excitation signal variation in a first self-test; storing a corresponding first response signal variation of the sensor device; exciting the sensor device using a second excitation signal variation in a second self-test; storing a corresponding second response signal variation of the sensor device; analyzing the first and second response signal variations with regard to at least one predefined criterion; and preparing a self-test result based on the analytical result of the first and second response signal variations.

10 Claims, 7 Drawing Sheets

METHOD FOR CARRYING OUT A SELF-TEST FOR A MICROMECHANICAL SENSOR DEVICE, AND CORRESPONDING MICROMECHANICAL SENSOR DEVICE

BACKGROUND INFORMATION

In the use of micromechanical sensors, self-testing concepts are frequently employed to test the micromechanical system as well as the complete signal path of the sensors. Tests based on such self-testing concepts may involve, for example, application of an electrical stimulus to the micromechanical element and measurement of the response by the sensor. The measured signal or a variable derived therefrom is compared to target values and evaluated. The target values may be documented in writing (in technical customer specification sheets, for example) or stored in the sensor itself. The self-test per se is usually composed of a sequence of stimuli, for example a positive voltage excursion, a zero excursion (no self-test stimulus), and a negative voltage excursion, or the like.

There are various ways to initiate self-tests and evaluate the corresponding sensor response to the self-test stimulus.

For certain sensors, the self-test is externally controlled by an external controller; i.e., the sensor is notified via an interface that a self-test is to be carried out. When the self-test is controlled by an external controller, the transmitted sensor response is usually evaluated in the controller.

Other sensors, in particular those which due to their unidirectional interface are not able to receive external signals, or which must be active, without intervention of a controller, very soon after the power supply is activated, automatically initiate the self-test (for example, during a start, or repeatedly during operation). When the self-test is initiated by the sensor itself, the evaluation with respect to stored target values also takes place in the sensor itself.

The sensor response to the self-test stimulus may be distorted externally or even completely overridden by interferences of the measured value. An evaluation of the sensor response with respect to stored values may then erroneously result in an unsatisfactory outcome.

The sequence of the self-test in a constant time grid results in high susceptibility to an interference signal at the corresponding frequency (the frequency of the self-test refers to the frequency of a corresponding periodic sinusoidal oscillation which best approximates a predefined periodic self-test sequence). As a result of the susceptibility, a self-test is currently dispensed with entirely for very sensitive sensors, or in installation positions with a high interference potential.

In sensors which automatically control the self-test and in which the self-test is not controlled by a controller, complex algorithms for controlling the self-test are not possible as a result of the limited computation resources, so that simple algorithms are used despite the described shortcoming.

A micromechanical sensor having error recognition is described in German Patent No. DE 10 2004 026 971, having a micromechanical function portion and an electronic evaluation circuit which are electrically connected to one another via electrical lines. This known sensor has means for carrying out a self-test of the sensor, which allow error recognition for at least one electrical connection.

SUMMARY OF THE INVENTION

The method according to the present invention for carrying out a self-test for a micromechanical sensor device and the corresponding micromechanical sensor device offer the advantage that they provide more robust self-test results compared to conventional approaches.

An essence of the present invention, therefore, lies in increased robustness of the self-test procedure and the self-test evaluation. The present invention provides that the results of at least two successive self-tests are compared to one another, correlated, or otherwise analyzed according to at least one predefined criterion, and on this basis the self-test result is established as a function of all self-test sequences.

For example, the present invention provides repetition of the self-test using a varied frequency or a varied period. In the evaluation it is no longer every single test signal that is individually evaluated, but, rather, variables which are additionally or exclusively derived from multiple tests, for example the mean value of all response signal values, or of specific positive, or all negative, response signal values. The self-test evaluation is thus made more stable with respect to external interferences of most varied amplitudes and frequencies. Also, in particular in sensors which are highly sensitive, this concept allows self-tests to be carried out and evaluated despite external interferences. The method according to the present invention is distinguished in that it requires only very slight use of resources in the controller and in the sensor.

DETAILED DESCRIPTION

Figure 1:
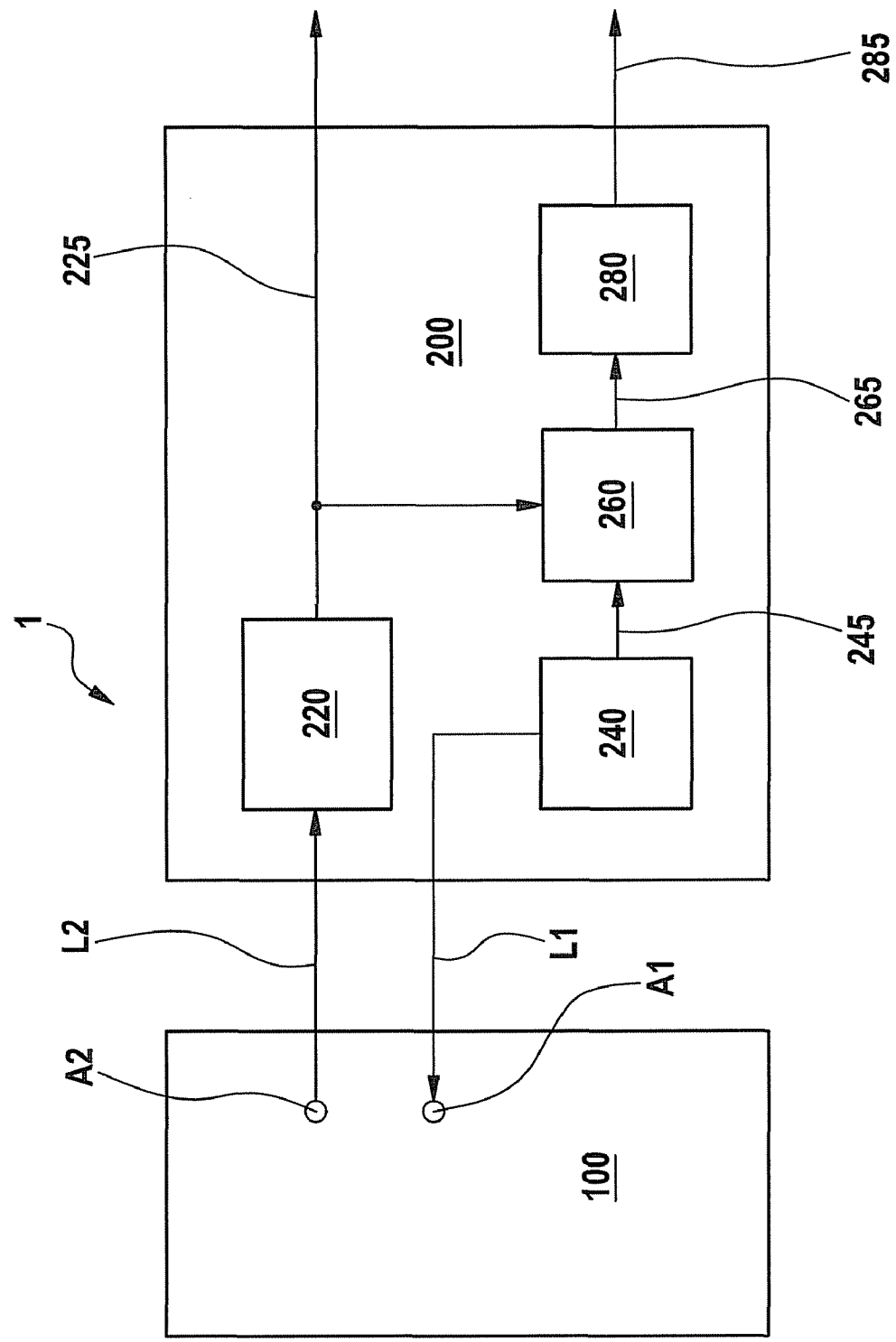
FIG. 1 shows a block diagram of a micromechanical sensor device according to one specific embodiment of the present invention.

Identical or functionally equivalent elements are denoted by the same reference numerals in the figures.

FIG. 1 shows a block diagram of a micromechanical sensor device according to one specific embodiment of the present invention.

In FIG. 1, reference numeral 1 denotes a micromechanical sensor unit having a micromechanical function portion 100 and an electronic evaluation circuit 200 which are electrically connected to one another via electrical lines L1, L2, respectively, the corresponding connecting points on the micromechanical function portion 100 being denoted by A1 and A2 and formed by bonding lands, for example.

Electronic evaluation circuit 200 includes an evaluation module 220, an excitation module 240, a demodulation module 260, and an assessment module 280.

Evaluation module 220 is used for evaluating the sensor signals during actual operation of the sensor, and also for evaluating the sensor signals in self-test mode, and delivers a sensor output signal 225 which in a micromechanical pressure sensor, for example, is a measure of the external pressure that is present.

In a predetermined operating state, for example after switching on the sensor, excitation module 240 sends at least two consecutive excitation signal variations within the scope of a self-test, via connection L1 to connection A1 of micromechanical function portion 100, and the excitation signal variations are stored in an internal memory (not illustrated).

This results in a response signal variation which is characteristic for each excitation signal variation, which is sent from connection A2 of the micromechanical function portion via line L2 to the evaluation module, which sends sensor output signal 225. In addition to the excitation signal variation, excitation module 240 provides correlation signal 245, which together with sensor output signal 225 is sent to demodulation module 260. A correlated demodulation of the signals takes place in the demodulation module 260, whereupon a demodulated output signal 265 is sent from demodulation module 260 to assessment module 280. Lastly, a test result is established in assessment module 280, based on signal pattern 265 which is analyzed using the at least one stored criterion, and is output as an appropriate test result signal 285. For example, at that location a check may be made as to whether at least one response signal variation in self-test mode is within predetermined upper and lower signal limits.

For this purpose, assessment module 280 has in particular a memory (not shown) for storing multiple, at least two, response signal variations of sensor device 1, which may be compared, correlated, or analyzed afterwards by assessment module 280, and on this basis the test result or the test result signal 285 relating thereto is formed. Assessment module 280 is advantageously part of a microprocessor device or an ASIC.

Figure 2:
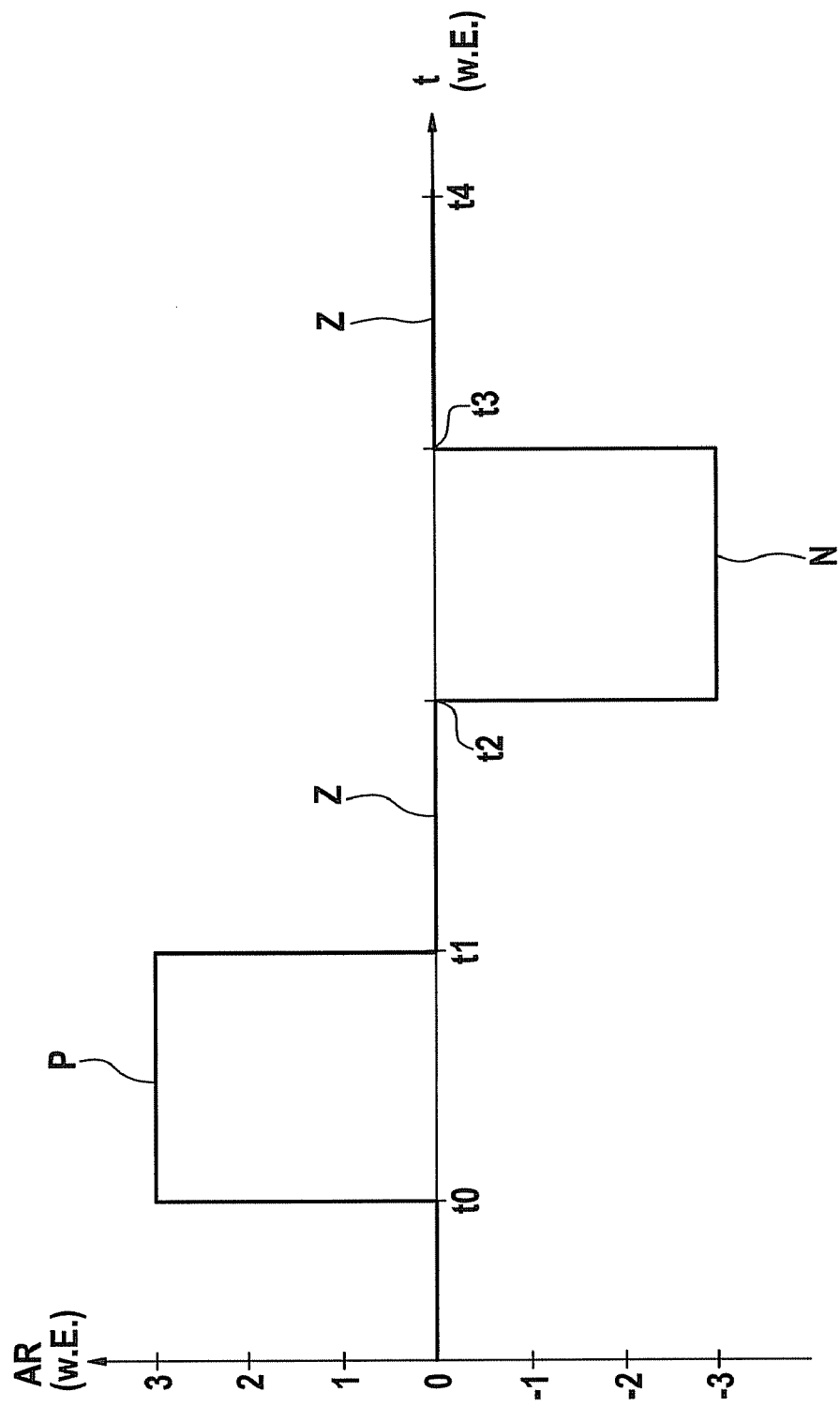
FIG. 2 shows a time diagram for illustrating an excitation signal variation for a self-test of the micromechanical sensor device according to FIG. 1.

FIG. 2 shows a time diagram for illustrating an excitation signal variation for a self-test of the micromechanical sensor device according to FIG. 1.

The excitation signal variation illustrated in FIG. 2 for a self-test of micromechanical sensor device 1 according to FIG. 1 starts at point in time t0 with a positive voltage excursion P having a rectangular shape, which lasts until point in time t1, amplitude AR thereof being three arbitrary units. From point in time t1 to point in time t2, a zero excursion Z takes place in which no excitation occurs. From point in time t2 to point in time t3, a negative voltage excursion N takes place, amplitude AR thereof being minus three arbitrary units. From point in time t3 to point in time t4 a zero excursion Z once again takes place. Variation of the excitation signal variation P-Z-N-Z having such a sequence is periodic, and may be approximated by an appropriate sinusoidal function. This sinusoidal function represents a nominal self-test frequency having period T=(t3−t0).

Figure 3:
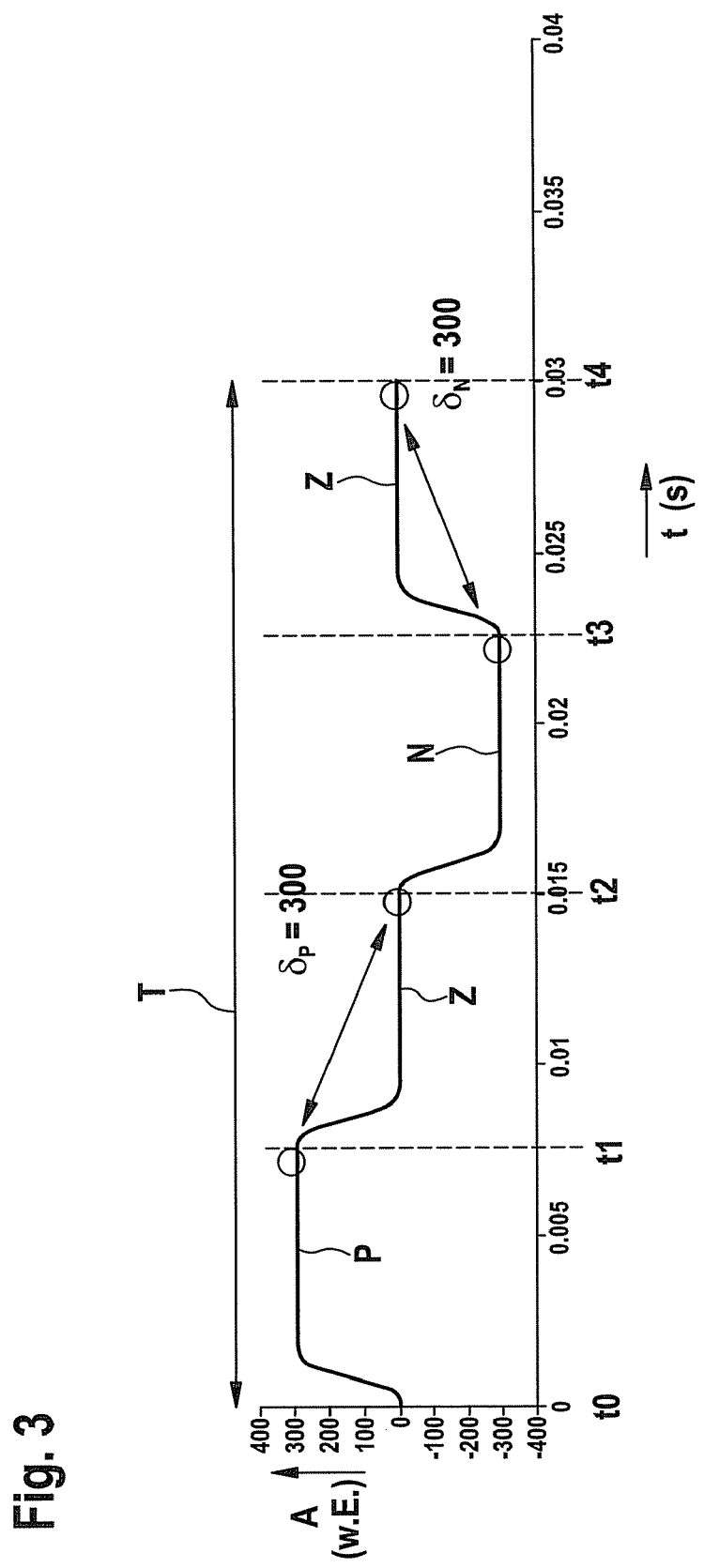
FIG. 3 shows a time diagram for illustrating a response signal variation for a self-test of the micromechanical sensor device according to FIG. 1, in response to the excitation signal variation according to FIG. 2, in the case of no interference.

FIG. 3 shows a time diagram for illustrating a response signal variation for a self-test of the micromechanical sensor device according to FIG. 1, in response to the excitation signal variation according to FIG. 2, in the case of no interference.

In the case of no interference, or for interferences at frequencies much smaller than self-test frequency 1/T, the difference between positive voltage excursion P and zero excursion Z as well as between negative voltage excursion N and zero excursion Z is evaluated, which is illustrated in FIG. 3 with $\delta_P$=300 a. u. (arbitrary units) and $\delta$=300 a. u. These differences $\delta_P$ and $\delta_N$ in the response signal variation, corresponding to the excitation signal variation from FIG. 2, are thus equal or approximately equal, as is apparent from FIG. 3, the entire test duration being 30 ms and the self-test frequency being 33 Hz. The amplitudes of the response signal illustrated in FIG. 3 are plus 300 or minus 300 arbitrary units, and are therefore in a predefined application-related window of [−300±20%, +300±20%] a. u. Due to low-pass effects, the flanks of the response signal variation according to FIG. 3 are different from the flanks of the excitation signal variation according to FIG. 2.

Figure 4:
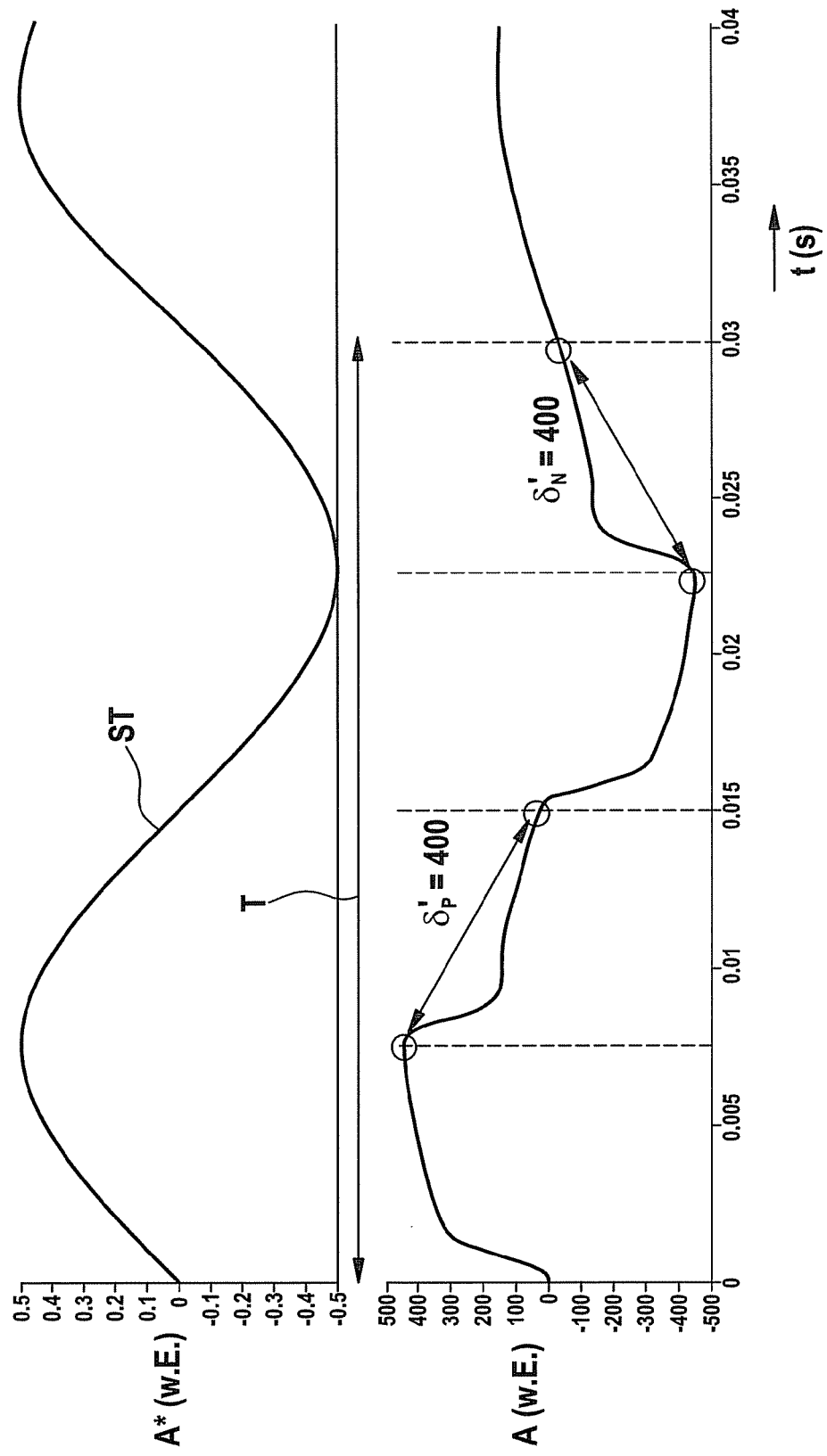
FIG. 4 shows a time diagram for illustrating an interference signal variation and a response signal variation for a self-test of the micromechanical sensor device according to FIG. 1, in response to the excitation signal variation according to FIG. 2, in a first interference case.

FIG. 4 shows a time diagram for illustrating an interference signal variation and a response signal variation for a self-test of the micromechanical sensor device according to FIG. 1, in response to the excitation signal variation according to FIG. 2, in a first interference case.

FIG. 4 shows the case in which interferences are present, the frequencies of which are near self-test frequency 1/T or the harmonics of these frequencies. The self-test signal is particularly sensitive to an interference near the self-test frequency, as illustrated in FIG. 4. The period in FIG. 4 is represented by T, and is likewise 30 ms. The interference signal is denoted by reference character ST, and has an amplitude A* of 0.5 a. u. However, these arbitrary units are different from the arbitrary units of the response signal.

Using the same evaluation criterion as for FIG. 3, the resulting difference between the positive voltage excursion and the zero excursion is $\delta_P'$=400 a. u., and the difference between the negative voltage excursion and the zero excursion is $\delta_N'$=400 a. u. These values are thus much higher than for the case of no interference according to FIG. 3, and are therefore outside the predefined application-related window of [−300±20%, +300±20%] a. u. In other words, in this case an individual self-test is not passed due to the interference. If this self-test were retained, it would be a reject.

Figure 5:
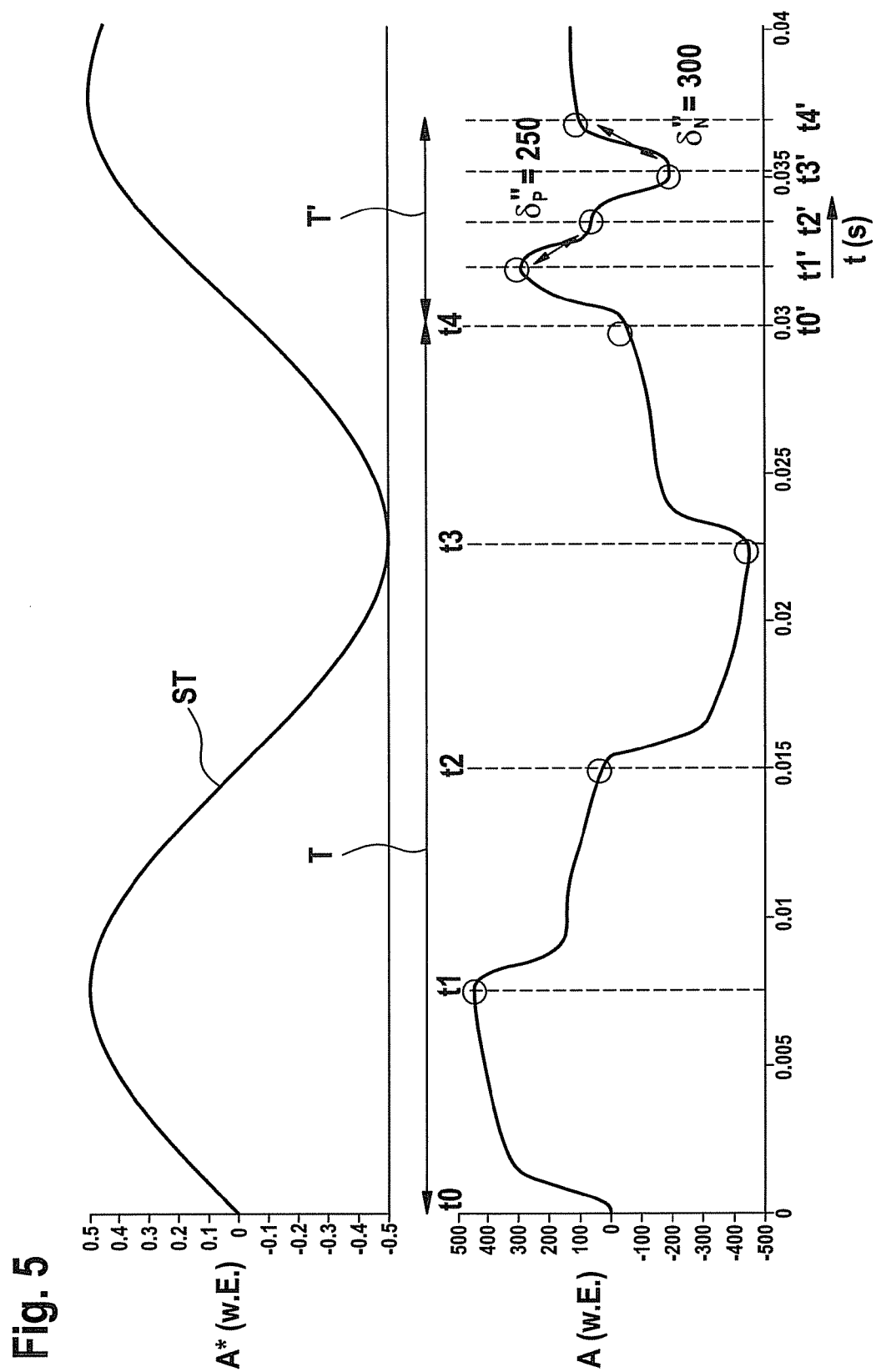
FIG. 5 shows a time diagram for illustrating an interference signal variation and a response signal variation for a self-test of the micromechanical sensor device according to FIG. 1, in response to the excitation signal variation according to FIG. 2 and a subsequent excitation signal variation, with a shortened period in the first interference case, and for illustrating a corresponding evaluation of the self-test.

FIG. 5 shows a time diagram for illustrating an interference signal variation and a response signal variation for a self-test of the micromechanical sensor device according to FIG. 1, in response to the excitation signal variation according to FIG. 2 and a subsequent excitation signal variation, with a shortened period in the first interference case, and for illustrating a corresponding evaluation of the self-test.

To increase the robustness of the self-test signal with respect to such interfering frequencies ST as illustrated in FIG. 4, in the specific embodiment according to FIG. 5 a repetition of the self-test signal and the excitation signal is provided, having an altered increased frequency or an altered period T' in time period t0'-t1'-t2'-t3'-t4' corresponding to signal sequence P-Z-N-Z. According to FIG. 5, self-test frequency 1/T' corresponding to period T' is 143 Hz, and period T'=7 ms. It may be advantageous when the test signal frequencies of the repetitions are not in a whole-number ratio with respect to one another.

For the test signal sequence having a decreased period T', the differences in question are $\delta_P''$=250 a. u. and $\delta_N''$=300 a. u.

The amplitudes of the second response signal illustrated in FIG. 5, having period T', are thus within the predefined application-related window of [−300±20%, +300±20%] a. u. Therefore, in this case the self-test would be passed.

If the results of various test signal sequences are compared to the various periods T, T' in assessment unit 280, and the criterion is established that at least one response signal is present in the referenced window, a positive test result is obtained for the signal having the lowest differences $\delta_P''=250$ a. u. and $\delta_N''=300$ a. u. Such a test sequence succession having two excitation signal variations with different periods T and T' thus gives a correct test signal result, i.e., which is not influenced by interference signal ST.

Of course, other self-test sequences having varying periods may be provided, and the selection may be made using a larger number of self-test sequences.

Figure 6:
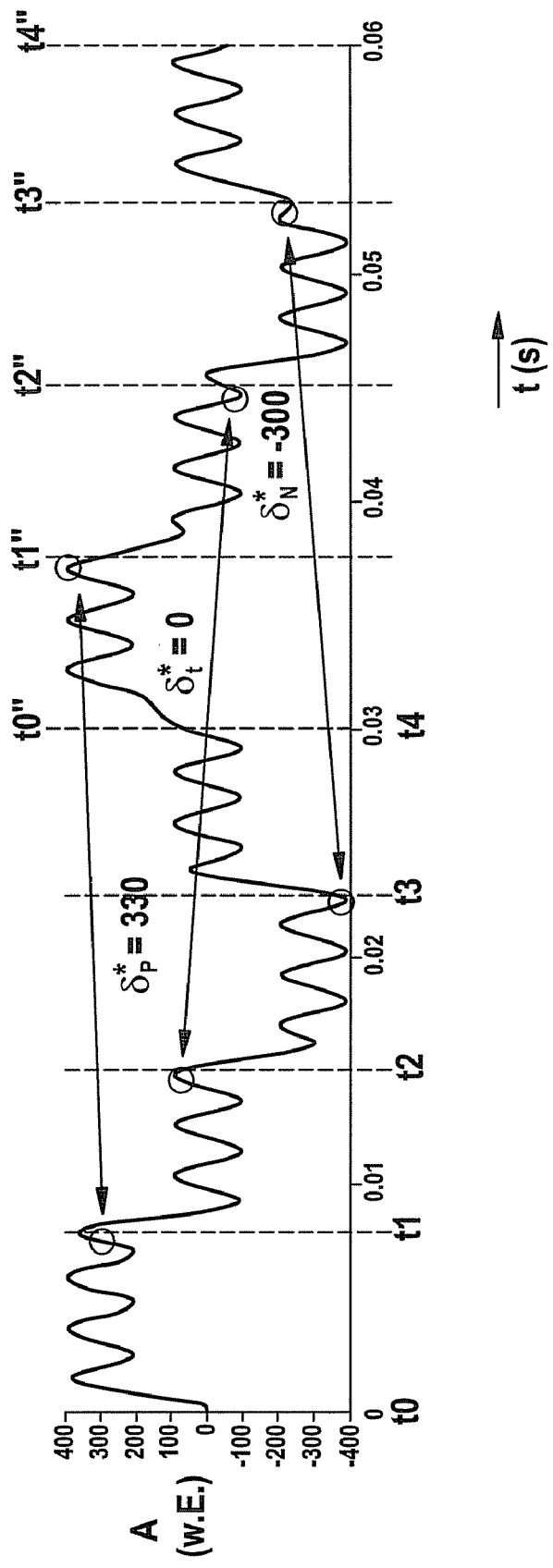
FIG. 6 shows a time diagram for illustrating an interference signal variation and a response signal variation for a self-test of the micromechanical sensor device according to FIG. 1, in response to a repeated excitation signal variation according to FIG. 2, in a second interference case, and for illustrating a corresponding evaluation of the self-test.

FIG. 6 shows a time diagram for illustrating an interference signal variation and a response signal variation for a self-test of the micromechanical sensor device according to FIG. 1, in response to the repeated excitation signal variation according to FIG. 2, in a second interference case, and for illustrating a corresponding evaluation of the self-test.

In the specific embodiment shown in FIG. 6, an interference is present which has a much higher frequency than the self-test frequency. To increase the stability of the test signal with respect to such large interfering frequencies, a repetition of the self-test sequence is likewise provided, period T remaining unchanged in this specific embodiment. The repetition takes place in time period t0"-t1"-t2"-t3"-t4" corresponding to signal sequence P-Z-N-Z. In this example the duration of the self-test is also 30 ms, corresponding to a frequency of 33 Hz. The interference in this case has a frequency of 500 Hz.

In addition to the assessment of each individual test signal by assessment module 280, there is also an assessment of the mean value of all test signals in the positive direction, in the negative direction, and for the zero excursion. Mean values of $\delta_P=330$ a. u., $\delta_Z^*=0$ a. u., and $\delta_N^*=300$ a. u., respectively, are obtained. The mean values are close to the value with no interference, and the self-test differences are thus close to the nominal value of 300 arbitrary units; therefore, the self-test is passed despite interference.

Figure 7:
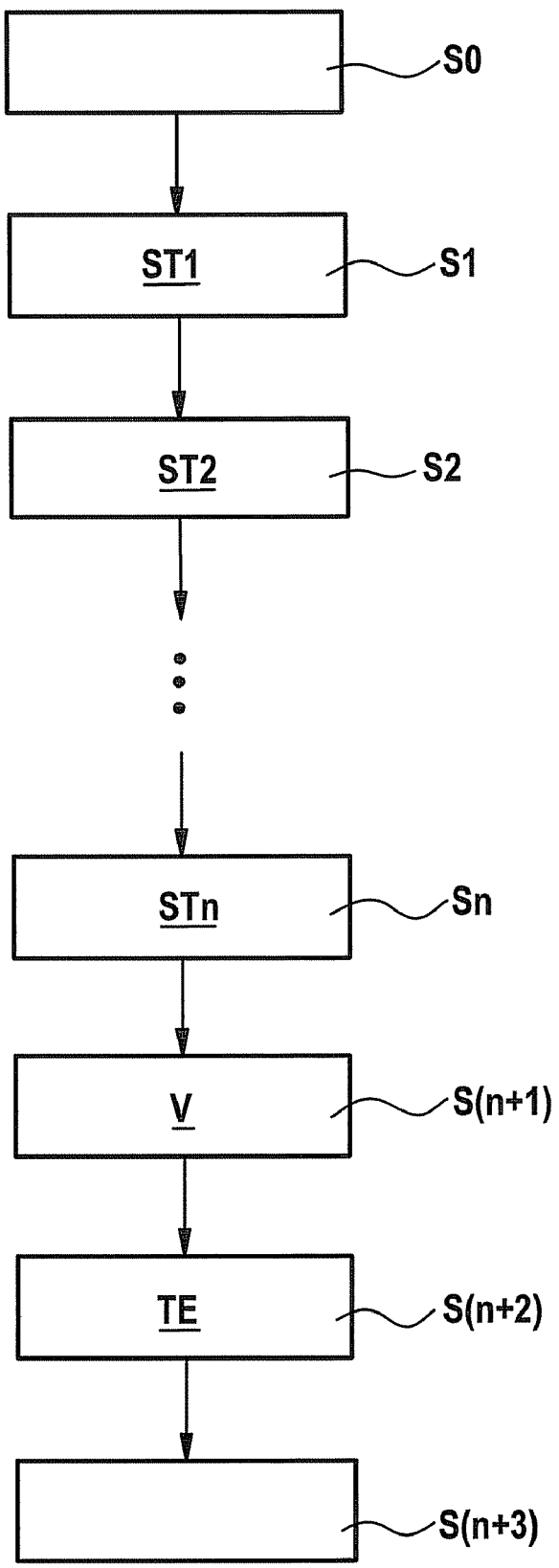
FIG. 7 shows a flow chart for illustrating a method for carrying out a self-test for a micromechanical sensor device according to another specific embodiment of the present invention.

FIG. 7 shows a flow chart for illustrating a method for carrying out a self-test for a micromechanical sensor device according to another specific embodiment of the present invention.

FIG. 7 schematically shows the process sequence of a method according to the present invention for carrying out a self-test for micromechanical sensor device 1.

The method starts in step S0. In step S1 a first self-test sequence ST1 having a first characteristic parameter variable is applied. In step S2 a second self-test sequence ST2 having a characteristic parameter variable which is the same or different is applied. This continues until step Sn, in which a self-test sequence STn having a characteristic parameter variable which is the same or different is applied.

After carrying out all self-tests and storing them in the memory of assessment module 280, a comparison, a correlation, or an analysis of self-test sequences ST1 through STn is then carried out in step S(n+1).

On this basis, in step S(n+2) a self-test result TE is established according to predetermined criteria, for example mean value formation and/or evaluation of various self-tests using different time scaling, different frequencies, etc.

The program ends in step S(n+3), in which test result signal 285 is output from assessment module 280, i.e., in the simplest case, "Test passed" or "Test failed."

Although the present invention has been described above with reference to preferred exemplary embodiments, it is not limited thereto, and may be modified in various ways.

Each of the described measures for comparing, correlating, or analyzing a plurality of at least two self-test sequences may be used alone or also in combination with the other measures. Thus, for example, the repetition of the test signal using an altered frequency may be combined with the evaluation of the mean values for one or several predefined time values of the first and second response signal variations.

Of course, the invention is not limited to periodic signal variations, and may be used for any given repeatable or time-scalable signal variations.

What is claimed is:

1. A method for carrying out a self-test for a micromechanical sensor device, comprising:
    exciting the sensor device using a first excitation signal variation in a first self-test;
    storing a corresponding first response signal variation of the sensor device;
    exciting the sensor device using a second excitation signal variation in a second self-test;
    storing a corresponding second response signal variation of the sensor device;
    analyzing the first and second response signal variations with regard to at least one predefined criterion; and
    preparing a self-test result based on an analytical result of the first and second response signal variations.

2. The method according to claim 1, wherein the first and second signal variations are periodic.

3. The method according to claim 2, wherein the periodic first and second excitation signal variations have a constant positive voltage excursion, a subsequent zero excursion, a subsequent negative voltage excursion, and a subsequent further zero excursion.

4. The method according to claim 3, wherein the positive voltage excursion and the negative voltage excursion have the same amplitude.

5. The method according to claim 3, wherein all four voltage excursions have the same duration.

6. The method according to claim 1, wherein at least one comparison criteria for comparing the first and second response signal variations are stored for the analysis.

7. The method according to claim 1, wherein for at least one predefined time value, corresponding values of the first and second response signal variations are averaged for the analysis.

8. The method according to claim 1, wherein the first and second excitation signal variations have the same signal variation over different time scales.

9. The method according to claim 8, wherein the first and second excitation signal variations are periodic and have different periods.

10. A micromechanical sensor device comprising:
    an excitation unit for exciting the sensor device using a first excitation signal variation in a first self-test, and for exciting the sensor device using a second excitation signal variation in a second self-test; and
    an evaluation unit for storing a corresponding first response signal variation of the sensor device, and for storing a corresponding second response signal variation of the sensor device, the evaluation unit analyzing the first and second response signal variations with regard to at least one predefined criterion, the evaluation unit preparing a self-test result based on an analytical result of the first and second response signal variations.

* * * * *